(12) United States Patent
Hofmeister

(10) Patent No.: US 6,481,956 B1
(45) Date of Patent: Nov. 19, 2002

(54) METHOD OF TRANSFERRING SUBSTRATES WITH TWO DIFFERENT SUBSTRATE HOLDING END EFFECTORS

(75) Inventor: Christopher A. Hofmeister, Hampstead, NH (US)

(73) Assignee: Brooks Automation Inc., Chelmsford, MA (US)

( * ) Notice: Subject to any disclaimer, the term of this patent is extended or adjusted under 35 U.S.C. 154(b) by 745 days.

(21) Appl. No.: 09/044,820

(22) Filed: Mar. 20, 1998

Related U.S. Application Data

(63) Continuation-in-part of application No. 08/587,087, filed on Jan. 16, 1996, which is a continuation-in-part of application No. 08/549,995, filed on Oct. 27, 1995, now Pat. No. 5,647,724.

(51) Int. Cl.[7] .............................................. B66C 23/00
(52) U.S. Cl. .................... 414/806; 414/744.5; 414/810; 414/941
(58) Field of Search ......................... 414/744.5, 744.6, 414/937, 940, 806, 808, 810, 941

(56) References Cited

U.S. PATENT DOCUMENTS

| | | |
|---|---|---|
| 1,190,215 A | 7/1916 | Becker |
| 2,282,608 A | 5/1942 | Rempel |
| 3,272,350 A | 9/1966 | Pflaumer et al. |
| 3,730,595 A | 5/1973 | Yakubowski ................. 302/2 R |
| 3,768,714 A | 10/1973 | Applequist et al. ........... 226/37 |
| 3,823,836 A | 7/1974 | Cheney et al. ......... 214/16.4 R |
| 3,874,525 A | 4/1975 | Hassan et al. ............. 214/17 B |
| 4,062,463 A | 12/1977 | Hillman et al. ............. 214/301 |
| 4,094,722 A | 6/1978 | Yamamoto et al. ......... 156/345 |
| 4,109,170 A | 8/1978 | Fujita et al. ............... 310/68 R |
| 4,208,159 A | 6/1980 | Uehara et al. .............. 414/225 |
| 4,381,965 A | 5/1983 | Maher, Jr. et al. .......... 156/345 |
| 4,666,366 A | 5/1987 | Davis .......................... 414/749 |
| 4,675,096 A | 6/1987 | Tateishi et al. ............. 204/298 |
| 4,721,971 A | 1/1988 | Scott .......................... 354/105 |
| 4,730,975 A | 3/1988 | Munakata .................... 414/735 |
| 4,907,467 A | 3/1990 | Toyoda et al. ................. 74/479 |
| 4,909,701 A | 3/1990 | Hardegen et al. ........... 414/749 |
| 4,951,601 A | 8/1990 | Maydan et al. ............. 118/719 |
| 5,046,909 A | 9/1991 | Murdock .................... 414/225 |
| 5,151,008 A | 9/1992 | Ishida et al. ............. 414/744.5 |
| 5,180,276 A | 1/1993 | Hendrickson ............... 414/752 |
| 5,183,370 A | 2/1993 | Cruz .......................... 414/416 |
| 5,270,600 A | 12/1993 | Hashimoto ................ 310/75 D |
| 5,333,986 A | 8/1994 | Mizukami et al. .......... 414/217 |
| 5,404,894 A | 4/1995 | Shiraiwa ...................... 134/66 |
| 5,447,409 A | 9/1995 | Grunes et al. ........... 414/744.6 |
| 5,512,320 A | 4/1996 | Turner et al. ............... 427/255 |
| 5,647,724 A | 7/1997 | Davis, Jr. et al. ........ 414/744.5 |

FOREIGN PATENT DOCUMENTS

| | | | |
|---|---|---|---|
| EP | 0423608 | 4/1991 | |
| JP | 2-292153 | 3/1990 | |
| JP | 4-30552 | 2/1992 | |
| JP | 4-61146 A | * 2/1992 | ................. 414/941 |

* cited by examiner

Primary Examiner—Donald W. Underwood
(74) Attorney, Agent, or Firm—Perman & Green, LLP

(57) ABSTRACT

A method of transferring semi-conductor substrates from a first location to a second location. The first and second locations are adapted to hold a plurality of the substrates in individual support area. The method comprises use of a transfer mechanism with two substrate holding end effectors which each have support areas adapted to individually support different maximum numbers of substrates thereon. The substrates are transferred from the first location to the second location with the first end effector and, when empty individual support areas in the second location or substrates at the first location are less than the maximum number of support areas on the first end effector, transferring substrates from the first location to the second location with use of the second end effector.

22 Claims, 8 Drawing Sheets

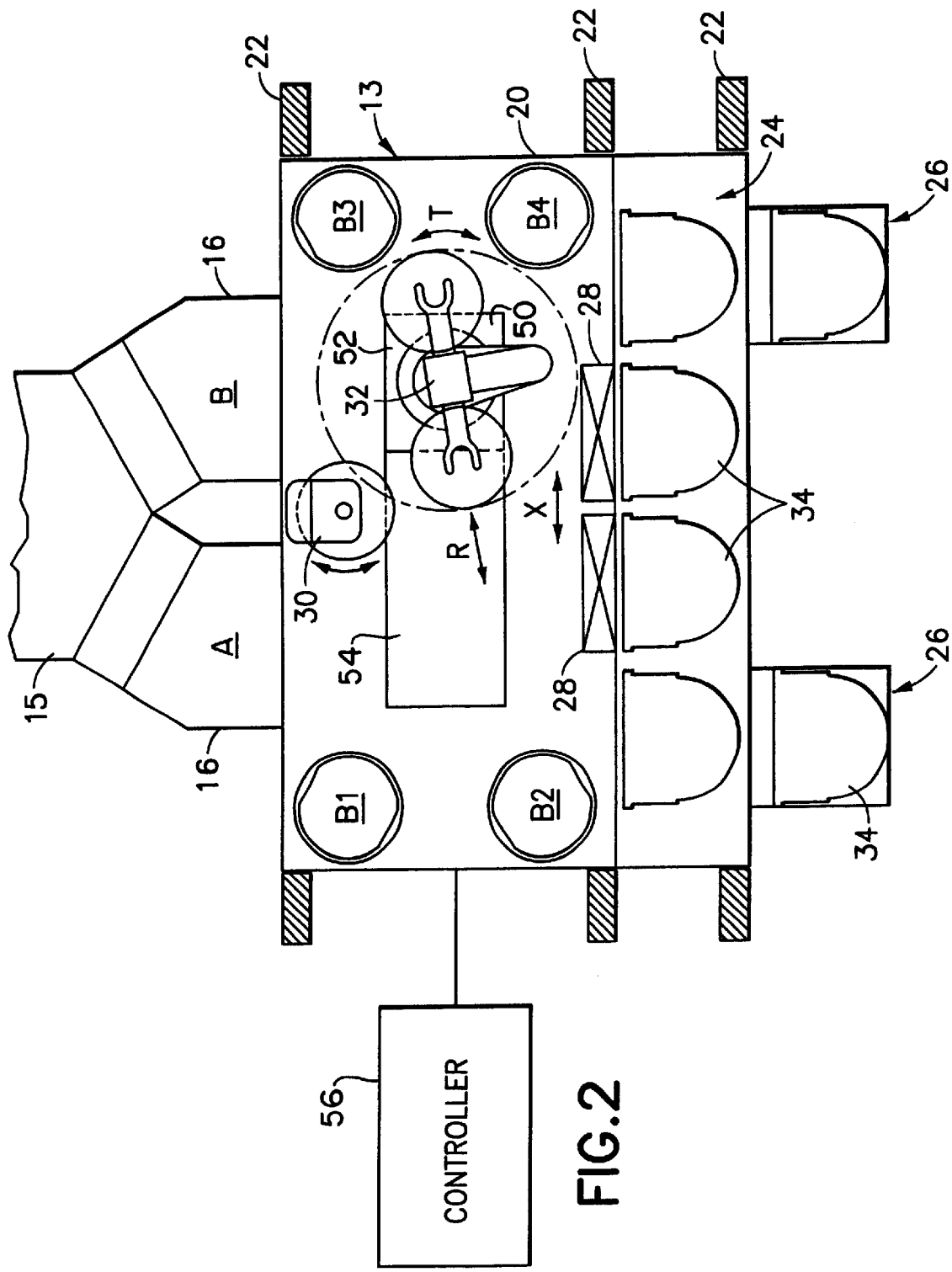

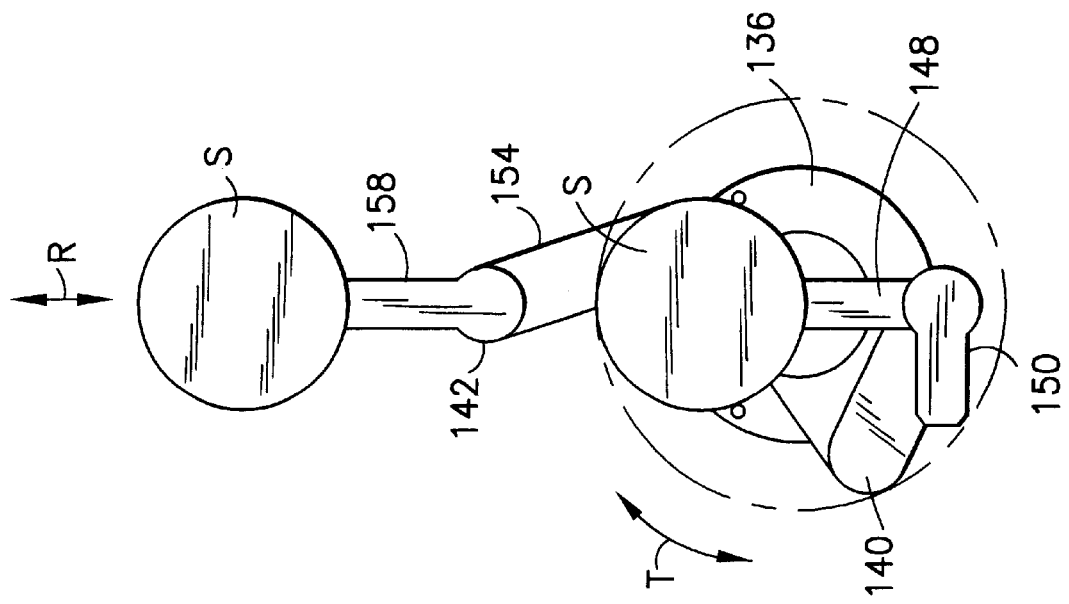
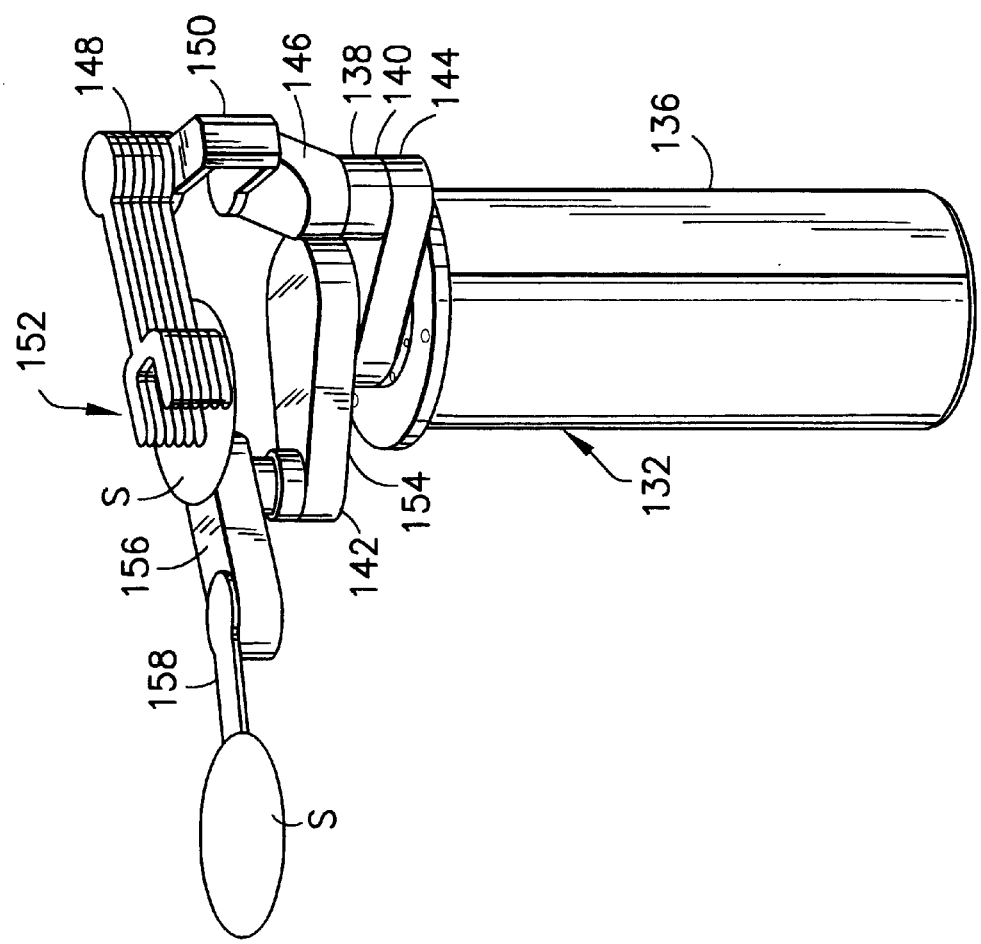

METHOD OF TRANSFERRING SUBSTRATES WITH TWO DIFFERENT SUBSTRATE HOLDING END EFFECTORS

CROSS-REFERENCE TO RELATED APPLICATION

This is a continuation-in-part application of application Ser. No. 08/587,087 filed Jan. 16, 1996, which is a continuation-in-part of application Ser. No. 08/549,995 filed Oct. 27, 1995, now U.S. Pat. No. 5,647,724.

BACKGROUND OF THE INVENTION

1. Field of the Invention

The present invention relates to a substrate processing apparatus and, more particularly, to a method of moving substrates.

2. Prior Art

U.S. Pat. No. 5,512,320 discloses a substrate processing apparatus with a section having a vacuum environment, a section in atmospheric pressure having substrate cassettes and a robot, and load locks or chambers between the two sections. Various substrate transport robot and substrate holding end effectors are also known in the art.

SUMMARY OF THE INVENTION

In accordance with one method of the present invention a method of transferring semiconductors substrates from a first location to a second location is provided. The first and second locations are adapted to hold a plurality of the substrates in individual support areas. The method comprises steps of providing a transfer mechanism with a first end effector and a second end effector, the first end effector having a first number of support areas adapted to individually support a first maximum number of substrates thereon and the second end effector having a second number of support areas adapted to individually support a second lower maximum number of substrates thereon; transferring substrates from the first location to the second location with the first end effector; and, when empty individual support areas in the second location are less than the first number of support areas on the first end effector, transferring substrates from the first location to the second location with use of only the second end effector and not the first end effector.

In accordance with another method of the present invention a method of manufacturing a straight transport mechanism for transporting substrates between a first location and a second location is provided comprising steps of determining a number of a maximum substrate holding capacity of the first location; selecting a first end effector and connecting the first end effector to a robot of the substrate transport mechanism, the first end effector having a first substrate area for individually supporting a first maximum number of substrates; and connecting a second end connector to the robot, the second end effector having a second substrate area for individually supporting a second maximum number of substrates which is less than the first maximum number of substrates. The step of selecting the first end effector and the first maximum number of substrates which it can support is based upon a formula.

In accordance with another method of the present invention a method of transferring semiconductor substrates from a first location to a second location is provided. The first and second locations are adapted to hold a plurality of substrates in individual support areas. The method comprises steps of providing a transfer mechanism with a first end effector and a second end effector; transferring substrates from a first substrate cassette at the first location to the second location with at least one of the end effectors; and transferring substrates from a second substrate cassette at the first location to the second location with at least one of the end effectors. The first substrate cassette is unloaded until it is empty and then the second substrate cassette is unloaded until the second location is at a full condition.

BRIEF DESCRIPTION OF THE DRAWINGS

The foregoing aspects and other features of the invention are explained in the following description, taken in connection with the accompanying drawings, wherein:

FIG. 2 is a schematic top plan view of the atmospheric section of the apparatus shown in FIG. 1 attached to the load locks;

FIG. 3A is perspective view of an alternate embodiment of the substrate transport robot;

FIG. 3B is a top plan view of the robot shown in FIG. 3A;

DETAILED DESCRIPTION OF THE PREFERRED EMBODIMENT

Figure 1:
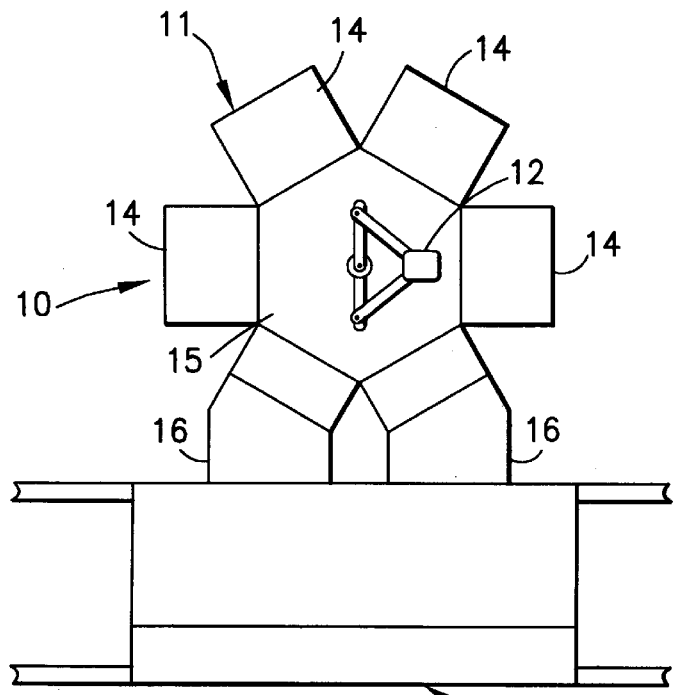
FIG. 1 is a schematic top plan view of a substrate processing apparatus incorporating features of the present invention.

Referring to FIG. 1, there is shown a schematic top plan view of a substrate processing apparatus 10 incorporating features of the present invention. Although the present invention will be described with reference to the single embodiment shown in the drawings, it should be understood that the present invention may be embodied in many different alternative forms of alternate embodiments. In addition, any suitable size, shape or type of elements or materials could be used.

The apparatus 10 generally comprises a substrate treatment section 11 and a substrate loading section 13. The treatment section 11 generally comprises a robot arm transport mechanism 12, substrate processing modules 14 connected to a main chamber 15, and load locks 16. The treatment section 11 may be any one of a number of substrate treatment sections well known in the art. Therefore, the treatment section will not be described further herein.

Attached to the front end of the load locks 16 is the loading section 13. Referring also to FIG. 2, the loading section 13 generally comprises a frame 20 attached to clean room walls 22, a substrate cassette stocker 24, two cassette load ports 26, two substrate cassette pod door removers 28, four buffer cassettes B1, B2, B3, B4, a substrate aligner 30, and a substrate transport robot 32. The stocker 24 is adapted to hold a plurality of substrate cassettes or capsils 34, such as ten or twenty. The cassettes 34 are well known in the art. Each cassette 34 has a housing which can individually support substrates therein. Customarily the cassettes can support either thirteen or twenty-five substrates. The substrates are semi-conductor wafers, but the present invention could be used with other types of substrates, such as flat panel display substrates. The cassettes could also hold numbers of substrates other than thirteen or twenty-five. The cassettes 34 are loaded and unloaded from the stocker 24 at the load ports 26 by a user. The stocker 24 moves the cassettes to position them in front of the door removers 28. The door removers 28 move doors of the cassettes 34 to allow access to the interior of the cassettes by the robot 32. The tool stocker 24 preferably has the capacity to hold twenty 300 mm, 13 wafer capsil's or ten 300 mm, 25 wafer capsil's. The two door removal mechanisms 28 are for synchronous capsil access. The load ports 26 have an automatic door as well as automatic tray. The tool stocker 24 preferably maintains a better than Class 1 environment internally. The tool stocker preferably has a dedicated controller.

In the embodiment shown the loading section 13 has the four buffer cassettes B1–B4. However, in alternate embodiments more or less buffer cassettes could be provided. In one alternate embodiment no buffer cassettes are provided, such as when the robot 32 transports substrates directly between cassettes 34 in the stocker 24 and the load locks 16. The buffers B1–B4 are preferably designed to support a plurality of the substrates individually in a spaced stack similar to the cassettes 34. The buffers preferably have a capacity to hold 26 wafers each with a 10 mm pitch. The buffers may be eliminated if there is no pre or post align or if repeated capsil access is acceptable. The load locks 16 are also preferably designed to support a plurality of the substrates individually in a spaced stack. Preferably the number of individual substrate holding areas in each buffer is the same as the number of individual substrate holding areas in each load lock. The aligner 30 is well known in the art and is used to individually align the surface structure of each substrate before entry into the load locks 16 or after removal of the substrates from the load locks. The aligner is preferably a single rotate axis design which corrects for angular orientation. It utilizes the robot 32 to correct for position orientation. The aligner capability can be offered as a stationary module as shown, integrated on the T axis of the robot 32 or integrated into the end effector of the robot 32. The aligner preferably has a dedicated controller. However, in alternate embodiments the aligner need not be provided in the loading section 13.

Figure 3:
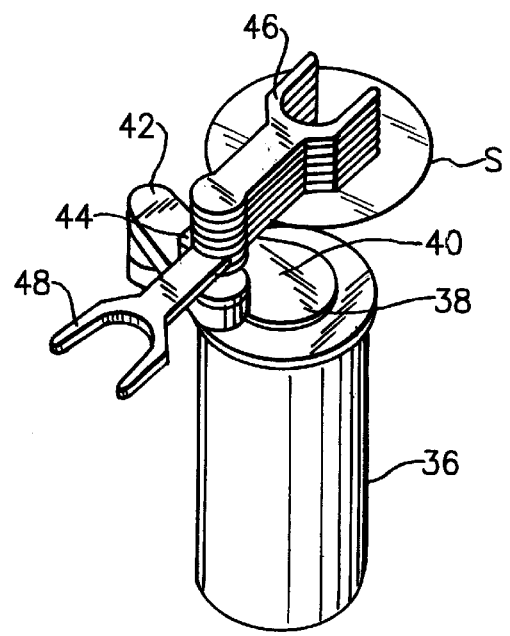
FIG. 3 is a perspective of the substrate transport robot shown in FIG. 2.

Referring also to FIG. 3, the substrate transport robot 32 generally comprises a drive section 36 and a movable arm assembly 38. The drive section 36 is preferably a magnetic drive system having a drive shaft assembly such as disclosed in U.S. Pat. No. 5,270,600 which is hereby incorporated by reference in its entirety. However, in alternate embodiments, other types of drive sections could be provided. The movable arm assembly 38 includes two arms 40,42 connected in series; also known as a scara arm. The first arm 40 is directly connected to one of the drive shafts in the drive section 36. The second arm 42 is connected to another one of the drive shafts in the drive section 36 by a transmission system (not shown), such as a belt. Located at the distal end of the second arm 42 is a pivot section 44 that connects two end effector sections 46, 48 to the second arm 42. Preferably the pivot section 44 is connected to the second arm 42 to pivot based upon relative motion of the two arms 40, 42 relative to each other. The rear ends of the end effector sections 46, 48 are connected to the pivot section 44 to rotate therewith. The first end effector section 46 includes a plurality of substrate holders or support areas for individually supporting substrates S thereon. In the embodiment shown the first end effector section 46 has six holding areas for holding a maximum stack of six of the substrates at a 10 mm pitch. However, in alternate embodiments, more or less holding areas could be provided and, any suitable pitch could be provided. In the embodiment shown the second end effector section 48 has only one holding area for holding a maximum of one individual substrate thereon. In alternate embodiments the second end effector section can have more than one substrate holding area. The robot 32 is preferably mounted on a movement mechanism 50 for moving the robot 32 linearly relative to the frame 20 as indicated by arrow X. An example of one type of movement mechanism can be found in U.S. patent application Ser. No. 08/891,523 which is hereby incorporated by reference in its entirety. The movement mechanism 50 includes a car 52 mounted on a track of the frame 20 to move the car 52 along the area 54. The robot 32 is mounted to the car 52 to move with the car. The robot 32 and the movement mechanism 50 are connected to a controller 56, such as a computer. The controller 56 is adapted to control movement of the movement mechanism 50 and robot 32 to provide four motions for the end effectors; X, T, R and the Z or vertical direction. This is used to move the substrates, via the movement mechanism 50 and robot 32 among the source and target locations; cassettes 34, buffers B1–B4, aligner 30, and load locks 16. Preferably the controller 56 has a preprogrammed method which can interact with the operation and control of the controller of the substrate treatment section 11 and, more specifically, with the opening and closing of the front doors to the load locks 16.

Referring now to FIGS. 3A and 3B, an alternate embodiment of the substrate transport robot is shown. The robot 132 has a drive section 136 and a movable arm assembly 138. The drive section 136 is substantially the same as the drive section 36 described above. However, any suitable type of drive section could be used. The movable arm assembly 138 is comprised of two scara arms 140, 142 connected to the drive section 136. The first scara arm 140 has a first inner arm 144, a first outer arm 146, and a first end effector 148. The outer arm 146 is pivotably connected to the inner arm 144. The end effector 148 is pivotably connected to the outer arm 146. A suitable transmission or drive system is provided to controllably rotate the first end effector 148 relative to the outer arm 146 and rotate the outer arm 146 relative to the inner arm 144. In this embodiment, the first end effector 148 has a pass-through section 150 and six holding areas or support areas 152 for individually and separately supporting substrates S thereon (only one substrate is shown on the first end effector for the sake of clarity). The pass-through section 150 allows a portion of the second scara arm 142 to pass therethrough. The second scara arm 142 has a second inner arm 154, a second outer arm 156, and a second end effector 158. The second end effector 158 is controllably rotatable on the second outer arm 156. The second outer arm 156 is controllably rotatable on the second inner arm 154. In this embodiment, the second end effector 158 has a single substrate holding area for supporting a single substrate S thereon.

The two scara arms 140, 142 can be manipulated between retracted positions (such as shown by the position of the first scara arm 140) and extended positions (such as shown by the position of the second scara arm 142) as indicated by arrow R. The arms 140, 142, while both in a retracted home position, can be rotated about the center axis of the drive section 136 as indicated by arrow T. Area W indicates the relatively small footprint of the path of the scara arms 140, 142 when they are rotated about the center axis. In alternate embodiments, any suitable type of substrate transport robot for moving two groups of substrates could be provided.

Figure 4A:
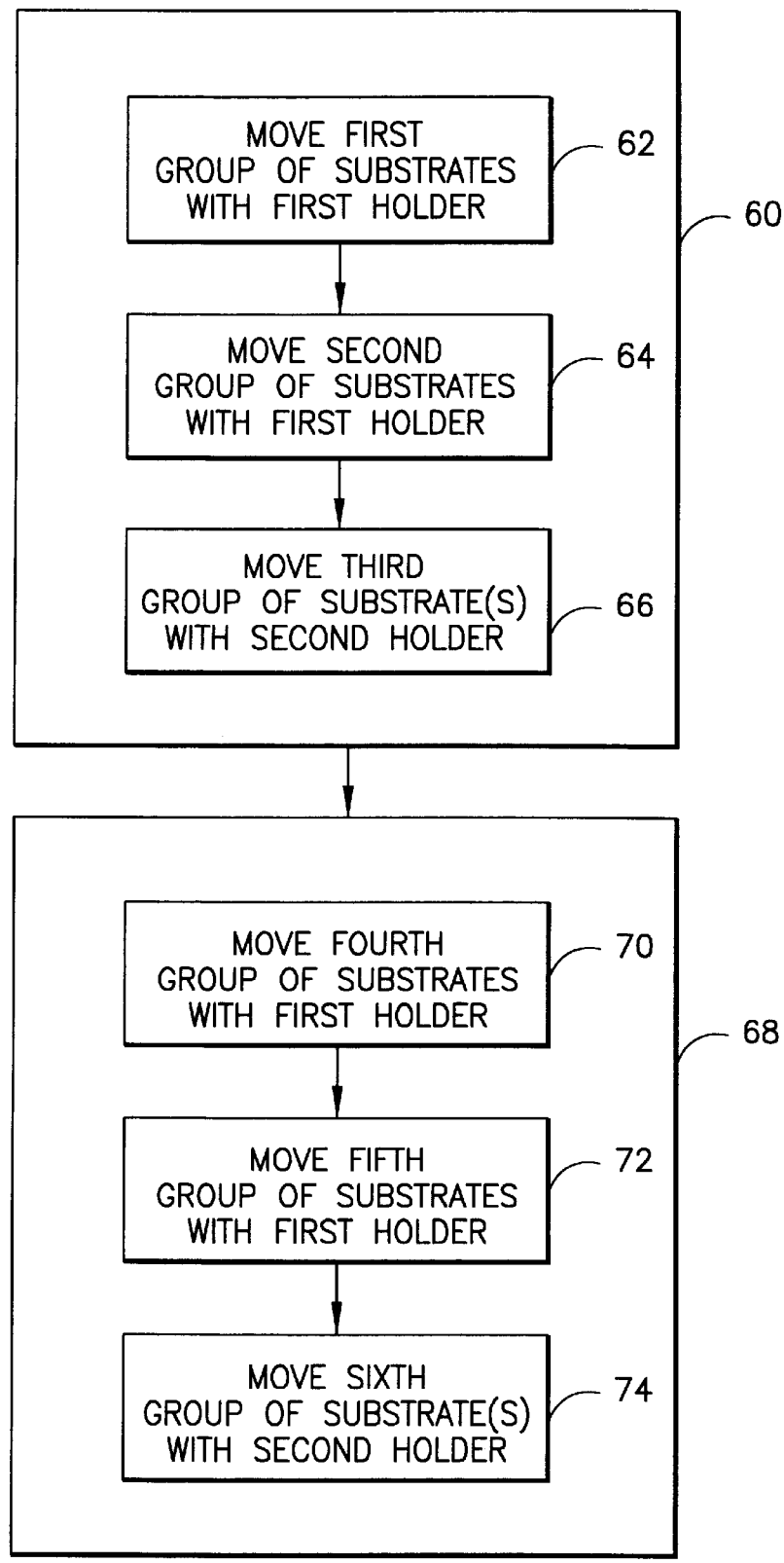
FIG. 4A is a schematic block diagram showing one method of moving substrates between two locations in the atmospheric section shown in FIG. 2.
Figure 5A:
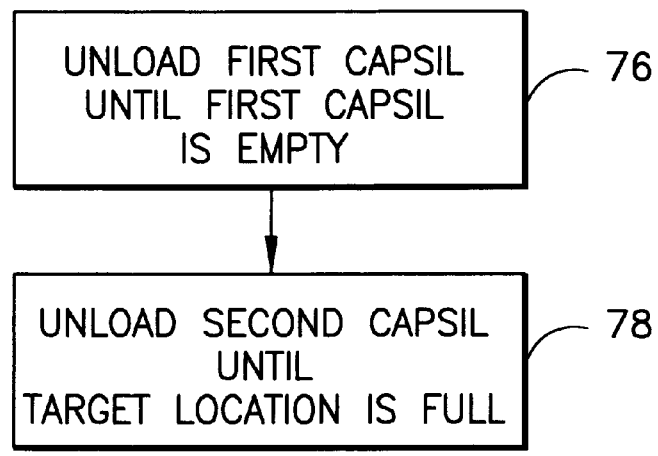
FIG. 5A is a schematic block diagram of steps used in the method of transporting substrates from the substrate holding cassettes to the buffers in the apparatus shown in FIG. 2.
Figure 5B:
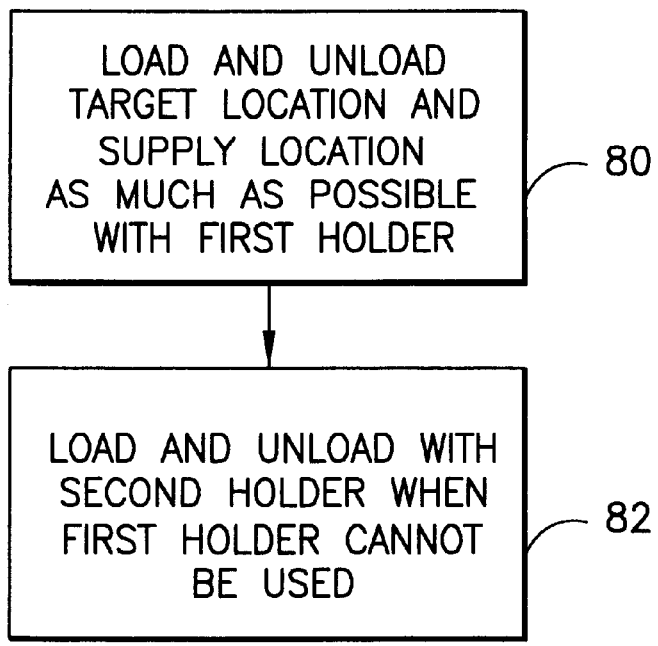
FIG. 5B is a schematic block diagram showing the steps used in the method of moving substrates in the apparatus shown in FIG. 2.

Referring also to FIG. 4A, one method of using the substrate loading section 13 will be described. FIG. 4A illustrates movement of substrates from two of the cassettes 34 to one of the buffers B4 for the situation where each cassette holds thirteen substrates and the buffer B4 can hold twenty-six substrates. The first cassette is unloaded as indicated by block 60 by moving a first group of substrates with the first holder as indicated by block 62, then moving a second group of substrates with the first holder as indicated by block 64, and then moving a third group of substrates with the second holder as indicated by block 66. Because the first holder 46 can hold six substrates and the second holder 48 can hold one substrate, the first step 62 moves six substrates, the second step 64 moves six substrates, and the third step 66 moves one substrate. Thus, the first cassette is fully unloaded and the buffer B4 is half full with thirteen substrates. The second cassette is then unloaded as indicated by block 68. A fourth group consisting of six substrates is moved with the first holder to the buffer B4 as indicated by block 70, then a fifth group consisting of six substrates is moved with the first holder to the buffer B4 as indicated by block 72, and then a sixth group of substrates consisting of the sole remaining substrate in the second cassette is moved with the second holder to the buffer B4. Thus, the second cassette of thirteen substrates is fully unloaded and the buffer B4 is filled to capacity with twenty-six substrates. With this type of embodiment, the end effector with the largest number of holding areas is used until such time that the number of substrates to be moved between two locations is less than the maximum number of holding areas for that end effector. Then, the end effector with the lower number of holding areas is used until the source location is empty and/or the target location is full. This is generally illustrated in FIG. 5A wherein the method comprises unloading a first cassette or capsil until the first capsil is empty, as illustrated by block 76. Then the method comprises unloading the second capsil until the target location is full as illustrated by block 78. The method as further illustrated in FIG. 5B generally comprises loading and unloading the target location and supply location as much as possible with the first holder, as illustrated by block 80, and then loading and unloading with the second holder when the first holder cannot be used, as illustrated by block 82.

Figure 5C:
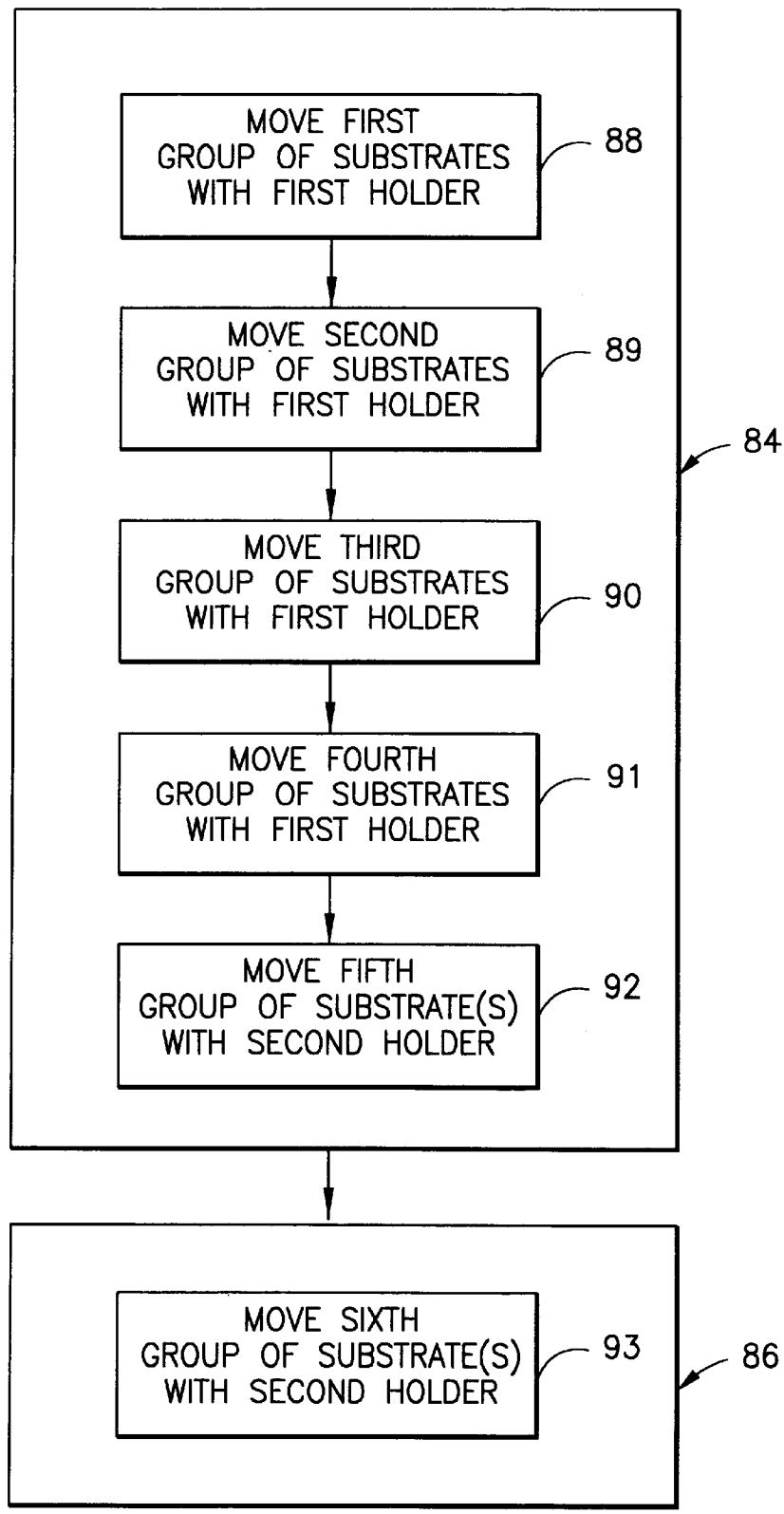
FIG. 5C is a schematic block diagram of another method used to move substrates with the robot shown in FIG. 2.

Referring now to FIG. 5C, another method is illustrated for transporting substrates from a supply location, such as a cassette having twenty-five substrates, to a target location, such as a buffer having twenty-six holding areas. In this situation, a first cassette is fully unloaded, as illustrated in block 84, and a second cassette is only partially unloaded, as illustrated by block 86, to fully load the target location. For the situation of the first holder having six holding areas, the second holder having one holding area, the source locations each having twenty-five substrates, and the target location having twenty-six holding areas, the transfer will occur by moving four groups of substrates 88–91 with the first holder totaling twenty-four transferred substrates. Then, as illustrated by block 92 a fifth group of substrate (one substrate) is transferred with the second holder. This empties the first cassette, but the target location still has one empty holding area. Therefore, as illustrated by block 93, a sixth group of substrates (one substrate) is moved with the second holder from the second cassette to the target location. Thus, even though the target location is now full, at least one supply location is only partially unloaded. This illustrates a scenario where the holding areas in the supply locations is smaller than the holding areas in the target locations or at least not a whole number multiple thereof. For the reverse, when the holding areas in the supply location is larger than the holding areas in the target location, the robot 32 and movement mechanism 50 move the substrates from the supply location to two target locations; fully emptying the supply location and at least partially filling the second target location.

Figure 6:
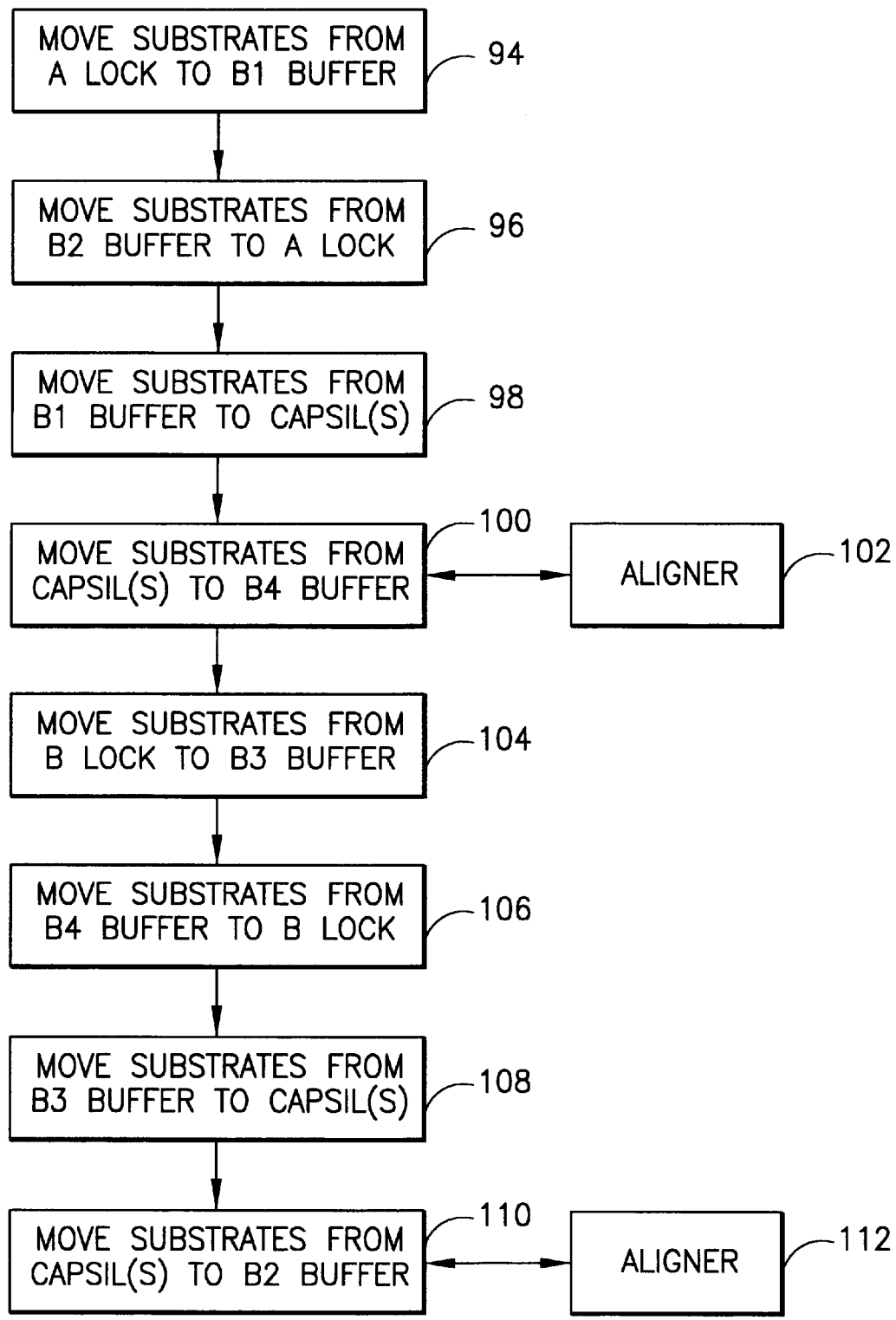
FIG. 6 is a schematic block diagram showing the steps used in one method of moving substrates between the load locks and substrate cassettes shown in FIG. 2.

Referring now to FIGS. 2 and 6, one method of using the substrate loading section 13 to transport substrates between the cassettes 34 at the door removers 28 and the load locks 16 by the robot 32 and the movement mechanism 50 will be described. Substrates are moved 94 from the A load lock to the buffer B1; thereby emptying the A load lock of processed substrates and filling the B1 buffer. Substrates are moved 96 from the B2 buffer to the A load lock; thereby filling the load lock with new unprocessed substrates and emptying the B2 buffer. Substrates are then moved 98 from the B1 buffer to one or more of the capsils/cassettes 34. This fills the capsils/cassettes 34 with processed substrates. The capsils/cassettes 34 are then moved by the stocker 24 to locate capsil/cassettes with unprocessed substrates at the door removers 28. Substrates are then moved 100 from the new capsils/cassettes 34 to the B4 buffer. The substrates in the B4 buffer are shuttled 102 back and forth to the aligner 30 for alignment. Substrates are moved 104 from the B load lock to the B3 buffer. This unloads the B load lock of processed substrates and fills the B3 buffer with those processed substrates. Unprocessed substrates are then moved 106 from the B4 buffer to the B load lock. The processed substrates in the B3 buffer are moved 108 from the B3 buffer to the capsils/cassettes 34. The stocker 24 replaces the capsils/cassettes having processed substrates with new capsils/cassettes having unprocessed substrates. Unprocessed substrates are then moved 110 from the new capsils/cassettes 34 to the B2 buffer. The substrates in the B2 buffer are shuttled 112 back and forth to the aligner 30 for alignment. The steps 94–112 are then repeated. However, in alternate embodiments other movement scenarios could be provided; especially if the structural layout and components are different.

Figure 7:
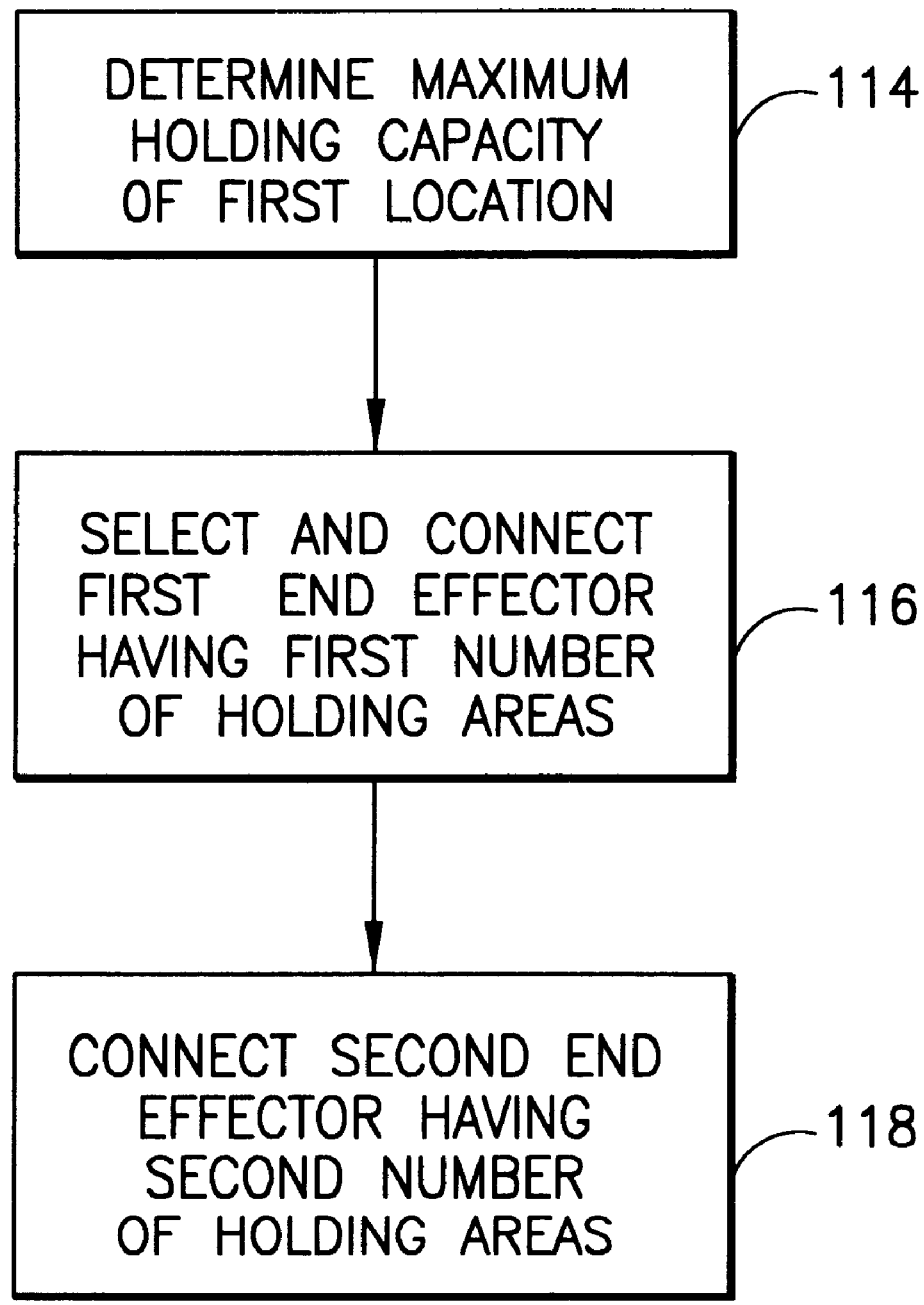
FIG. 7 is a schematic block diagram showing the steps used in one method of manufacturing a substrate transport mechanism.

The embodiment described above has a robot 32 with a single holding area end effector 48 and a six holding area end effector 46. However, end effectors having different members of end effectors could be provided. The present invention includes a method of manufacturing a substrate transport mechanism for transporting substrates between a first location and a second location. Referring to FIG. 7, the method comprises steps of determining 114 a number of a maximum substrate holding capacity of the first location; selecting 116 a first end effector and connecting the first end effector to a robot of the substrate transport mechanism, the first end effector having a first substrate area for individually supporting a first maximum number of substrates; and connecting 118 a second end effector to the robot, the second end effector having a second substrate area for individually supporting a second different maximum number of substrates which is less than the first maximum number of substrates. The step of selecting the first end effector and the first maximum number of substrates which it can support is based upon the following formula:

$$FEE_{\text{MAX}} = \frac{FL_{\text{MAX}} - SEE_{\text{MAX}}}{WND_{SEE}}$$

where, $FEE_{MAX}$ is the first maximum number of substrates which can be individually supported at the first substrate area of the first end effector, $FL_{MAX}$ is the number of the maximum substrate holding capacity of the first location, $SEE_{MAX}$ is the second maximum number of substrates which can be individually supported at the second substrate area of the second end effector, and $WND_{SEE}$ is a whole number which is divisible by $SEE_{MAX}$ into a whole number.

It should be understood that the foregoing description is only illustrative of the invention. Various alternatives and modifications can be devised by those skilled in the art without departing from the scope of the present invention. Accordingly, the present invention is intended to embrace all such alternatives, modifications and variances which fall within the scope of the appended claims.

What is claimed is:

1. A method of transferring semi-conductor substrates from a first location to a second location, the first and second locations being adapted to hold a plurality of the substrates in individual support areas, the method comprising steps of:
   providing a transfer mechanism with a first end effector and a second end effector, the first end effector having a first number of support areas adapted to individually support a first maximum number of substrates thereon and the second end effector having a second number of support areas adapted to individually support a second lower maximum number of substrates thereon;
   transferring substrates from the first location to the second location with the first end effector; and
   when empty individual support areas in the second location are less than the first number of support areas on the first end effector, transferring substrates from the first location to the second location with use of only the second end effector and not the first end effector.

2. A method as in claim 1 wherein the first location is a first substrate cassette at a cassette holding area.

3. A method as in claim 1 wherein the second location is a substrate buffer.

4. A method as in claim 3 wherein the first location is a first substrate cassette at a cassette holding area.

5. A method as in claim 3 wherein the first location is a load lock.

6. A method as in claim 1 wherein the second number of support areas on the second end effector is one.

7. A method as in claim 6 wherein the first number of support areas on the first end effector is six.

8. A method as in claim 6 further comprising transferring substrates from the second location to a substrate aligner and back to the second location by the second end effector.

9. A method as in claim 1 further comprising:
   transferring substrates from the second location to a third location with the first end effector; and
   when empty individual support areas in the second location or third location are less than the first number of support areas on the first end effector, transferring substrates from the second location to the third location with use of the second end effector.

10. A method as in claim 9 further comprising:
    transferring substrates from the third location to a fourth location with the first end effector; and
    when empty individual support areas in the third location or fourth location are less than the first number of support areas on the first end effector, transferring substrates from the third location to the fourth location with use of the second end effector.

11. A method of manufacturing a substrate transport mechanism for transporting substrates between a first location and a second location, the method comprising steps of:
    determining a number of a maximum substrate holding capacity of the first location;
    selecting a first end effector and connecting the first end effector to a robot of the substrate transport mechanism, the first end effector having a first substrate area for individually supporting a first maximum number of substrates; and
    connecting a second end effector to the robot, the second end effector having a second substrate area for individually supporting a second maximum number of substrates which is less than the first maximum number of substrates;
    Wherein the step of selecting the first end effector and the first maximum number of substrates which it can support is based upon the following formula:

$$FEE_{\text{MAX}} = \frac{FL_{\text{MAX}} - SEE_{\text{MAX}}}{WND_{SEE}}$$

where, $FEE_{MAX}$ is the first maximum number of substrates which can be individually supported at the first substrate area of the first end effector, $FL_{MAX}$ is the number of the maximum substrate holding capacity of the first location, $SEE_{MAX}$ is the second maximum number of substrates which can be individually supported at the second substrate area of the second end effector, and $WND_{SEE}$ is a whole number which is divisible by $SEE_{MAX}$ into a whole number.

12. A method of transferring semi-conductor substrates from a first location to a second location, the first and second locations being adapted to hold a plurality of the substrates in individual support areas, the method comprising steps of:
    providing a transfer mechanism with a first end effector and a second end effector, the first end effector having a first number of support areas adapted to individually support a first maximum number of substrates thereon and the second end effector having a second number of support areas adapted to individually support a second lower maximum number of substrates thereon;
    transferring substrates from a first substrate cassette at the first location to the second location with at least one of the end effectors; and
    transferring substrates from a second substrate cassette at the first location to the second location with at least one of the end effectors,
    wherein the first substrate cassette is unloaded until it is empty and then the second substrate cassette is unloaded until the second location is at a full condition, and
    wherein the step of transferring substrates from the first location to the second location comprises use of the second end effector when empty individual support areas in the second location are less than the first number of support areas on the first end effector.

13. A method as in claim 12 wherein the second location is a substrate buffer.

14. A method as in claim 12 wherein the second location is a load lock.

15. A method as in claim 12 wherein the second number of support areas on the second end effector is one.

16. A method as in claim 15 wherein the first number of support areas on the first end effector is six.

17. A method as in claim 15 further comprising transferring substrates from the second location to a substrate aligner and back to the second location by the second end effector.

18. A method as in claim 12 further comprising:
   transferring substrates from the second location to a third location with the first end effector; and
   when empty individual support areas in the second location or third location are less than the first number of support areas on the first end effector, transferring substrates from the second location to the third location with use of the second end effector.

19. A method as in claim 18 further comprising:
   transferring substrates from the third location to a fourth location with the first end effector; and
   when empty individual support areas in the third location or fourth location are less than the first number of support areas on the first end effector, transferring substrates from the third location to the fourth location with use of the second end effector.

20. A method of transferring substrates from a first location to a second location, the first and second locations being adapted to hold a plurality of the substrates in individual support areas, the method comprising steps of:
   providing a transfer mechanism with at least a first end effector and a second end effector, the first end effector having N number of support areas adapted to individually support N maximum number of substrates thereon, where N is a whole number greater than one, and the second end effector having a second number of support areas adapted to individually support a second maximum number of substrates thereon, the second maximum number being less than N;
   transferring T substrates from the first location to the second location by the transfer mechanism with use of both the first and second end effectors where T is a whole number, wherein the step of transferring comprises using the first end effector M times to transfer M*N substrates, where M is a whole number; and
   maximizing use of the first end effector such that $$M = \frac{T-C}{N}$$

where C is a whole number and C is less than N.

21. A method as in claim 20 wherein the step of transferring comprises use of the first end effector M times, where M is greater than one.

22. A method of transferring substrates from a first location to a second location, the first and second locations being adapted to hold a plurality of the substrates in individual support areas, the method comprising steps of:
   providing a transfer mechanism with a first end effector and a second end effector, the first end effector having a first number of support areas adapted to individually support a first maximum number of substrates thereon and the second end effector having a second number of support areas adapted to individually support a second lower maximum number of substrates thereon;
   transferring substrates from a first substrates cassette at the first location to the second location with at least one of the end effectors; and
   transferring substrates from a second substrate cassette at the first location to the second location with at least one of the end effectors,
   wherein the first substrate cassette is unloaded until it is empty and then the second substrate cassette is unloaded until the second location is at a full condition, and
   wherein the step of transferring substrates from the first location to the second location comprises use of the second end effector only when the number of substrates in the first substrate cassette is less than the first number of support areas on the first end effector.

* * * * *